United States Patent
Ogashiwa et al.

(10) Patent No.: US 12,157,170 B2
(45) Date of Patent: Dec. 3, 2024

(54) CONDUCTIVE BONDING MATERIAL, BONDING MEMBER INCLUDING THE CONDUCTIVE BONDING MATERIAL, AND BONDING METHOD

(71) Applicant: TANAKA KIKINZOKU KOGYO K.K., Tokyo (JP)

(72) Inventors: Toshinori Ogashiwa, Isehara (JP); Kazuo Ueda, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 179 days.

(21) Appl. No.: 17/796,846

(22) PCT Filed: Sep. 28, 2020

(86) PCT No.: PCT/JP2020/036541
§ 371 (c)(1),
(2) Date: Aug. 1, 2022

(87) PCT Pub. No.: WO2021/157125
PCT Pub. Date: Aug. 12, 2021

(65) Prior Publication Data
US 2023/0053435 A1    Feb. 23, 2023

(30) Foreign Application Priority Data
Feb. 4, 2020    (JP) .................................. 2020-017124

(51) Int. Cl.
*H01B 5/00*    (2006.01)
*B22F 1/05*    (2022.01)
(Continued)

(52) U.S. Cl.
CPC ................ *B22F 7/062* (2013.01); *B22F 1/05* (2022.01); *H01B 1/02* (2013.01); *H01B 5/00* (2013.01); *H01L 21/52* (2013.01)

(58) Field of Classification Search
CPC .................................... H01B 5/00; H01B 1/02
See application file for complete search history.

(56) References Cited

U.S. PATENT DOCUMENTS

2009/0230172 A1    9/2009 Ogashiwa et al.
2012/0055978 A1    3/2012 Schafer et al.
(Continued)

FOREIGN PATENT DOCUMENTS

JP    2007-324523 A    12/2007
JP    2012-060114 A    3/2012
(Continued)

OTHER PUBLICATIONS

Extended European Search Report issued in corresponding European Patent Application No. 20917955.5, dated May 12, 2023.
(Continued)

*Primary Examiner* — Khanh T Nguyen
(74) *Attorney, Agent, or Firm* — Foley & Lardner LLP

(57) ABSTRACT

A bonding method in which applied is a prescribed conductive bonding material, which contains a molded article of a metal powder. The metal powder is one or more selected from the group consisting of a gold powder, a silver powder, a platinum powder, and a palladium powder, and has a purity of 99.9% by mass or more, and an average particle size of 0.005 μm to 1.0 μm, and the conductive bonding material has a compressive deformation rate M, represented by the following expression, of 5% or more and 30% or less when compressed with a compression pressure of 5 MPa. [Expression 1] $M=\{(h1-h2)/h1\}\times 100$, wherein h1 represents an average thickness of the conductive bonding material before compression, and h2 represents an average thickness of the conductive bonding material after the compression.

9 Claims, 8 Drawing Sheets

(51) Int. Cl.
*B22F 7/06* (2006.01)
*H01B 1/02* (2006.01)
*H01L 21/52* (2006.01)

(56) References Cited

U.S. PATENT DOCUMENTS

| | | |
|---|---|---|
| 2017/0194169 A1 | 7/2017 | Schafer et al. |
| 2020/0058517 A1 | 2/2020 | Matsumoto |
| 2020/0376545 A1 | 12/2020 | Masuyama et al. |
| 2021/0351157 A1 | 11/2021 | Negishi et al. |

FOREIGN PATENT DOCUMENTS

| | | |
|---|---|---|
| JP | 2013-096008 A | 5/2013 |
| JP | 2014-067917 A | 4/2014 |
| JP | 2017-520907 A | 7/2017 |
| JP | 2018-206826 A | 12/2018 |
| JP | 2019-079883 A | 5/2019 |
| JP | 2019-173165 A | 10/2019 |
| WO | WO-2017/195399 A1 | 11/2017 |

OTHER PUBLICATIONS

International Searching Authority, "International Search Report," issued in connection with International Patent Application No. PCT/JP2020/036541, dated Dec. 8, 2020.

International Searching Authority, "Written Opinion," issued in connection with International Patent Application No. PCT/JP2020/036541, dated Dec. 8, 2020.

(i)

(ii)

(i)

(ii)

(i)

(ii)

(iii)

(iv)

(v)

(i)

(ii)

(iii)

(iv)

(v)

(a) Front Surface   (b) Back Surface (i)

(ii)

(iii)

(iv)

(v)

(i)

(ii)

(iii)

(iv)

(v)

(vi)

(vii)

CONDUCTIVE BONDING MATERIAL, BONDING MEMBER INCLUDING THE CONDUCTIVE BONDING MATERIAL, AND BONDING METHOD

CROSS-REFERENCE TO RELATED APPLICATIONS

The present application claims priority under 37 U.S.C. § 371 to International Patent Application No. PCT/JP2020/036541, filed Sep. 28, 2020, which claims priority to and the benefit of Japanese Patent Application No. 2020-017124, filed on Feb. 4, 2020. The contents of these applications are hereby incorporated by reference in their entireties.

BACKGROUND OF THE INVENTION

Field of the Invention

The present invention relates to a conductive bonding material applied to die bonding or flip-chip bonding of a semiconductor chip to a substrate, and a method for producing the conductive bonding material.

Description of the Related Art

In production of various semiconductor devices, die bonding or flip-chip bonding is performed as a process for bonding a semiconductor chip to a substrate. As a method for bonding such a semiconductor chip, the present applicant discloses a bonding method in which a sintered compact of a metal powder is applied as a conductive bonding material (for example, Patent Document 1). In this bonding method, a metal paste of a metal powder or the like having a prescribed particle size and containing high purity gold or the like is applied to a member to be bonded, such as a semiconductor chip, and the metal powder is sintered by heating at a temperature of 80 to 300° C. to obtain a metal powder sintered compact. Then, the member to be bonded is placed on a substrate, and the metal powder sintered compact is densified through compression under heating for bonding in this method.

As described above, in the conventional bonding method of the present applicant, the metal paste of the metal powder used as a bonding medium is applied before the bonding process of the member to be bonded, and furthermore, the metal powder is sintered to form a conductive bonding material. In this sintering process, metal powder particles are close to one another to be mutually thermally diffused to bond. Besides, at a given sintering temperature, necking of the metal powder particles can occur to cause a further firmly bonding state. The metal powder sintered compact formed through these actions is a sintered compact having certain compression deformation strength. This metal powder sintered compact is applied in the bonding method of the present applicant in order to inhibit the bonding member from breaking or coming off from the member to be bonded before the bonding process or during bonding.

Besides, the application of the metal powder sintered compact is regarded as useful also from the viewpoint of ensuring bonding strength of a bonding portion. In the bonding process, necking progression and plastic deformation of the metal particle itself are caused inside the metal powder sintered compact heated and compressed, and the sintered compact is densified with inside gaps reduced. The thus densified conductive bonding material firmly bonds a semiconductor chip to a substrate. It has been regarded that the metal powder sintered compact needs to be applied for causing such densification to smoothly progress.

In addition, the bonding method using the metal paste and the metal powder sintered compact can provide firm bond at a comparatively low temperature. Therefore, this bonding method is expected to take the place of a conventional bonding method by brazing, and has become widely applied to bonding of various semiconductor chips and electronic components.

PRIOR ART DOCUMENT

Patent Document

Patent Document 1: Japanese Patent Application Laid-Open No. 2007-324523

SUMMARY OF THE INVENTION

Technical Problem

In recent years, attention is being paid to devices in which not only Si-based semiconductors (such as monocrystalline Si, and SiC) but also compound semiconductors such as Ga-based semiconductors (GaAs, GaN, and GaP) are applied. This is because the compound semiconductors have advantages that they are excellent in high speed signal processing owing to the fact that an electron transfer rate is higher therein than in a conventional Si-based semiconductor. Also to bonding of a compound semiconductor, application of the above-described bonding method using the metal powder sintered compact can be expected.

According to examination made by the present inventors, however, it has been confirmed that the bonding method in which the metal paste and the metal powder sintered compact are applied is difficult to apply directly to bonding of a compound semiconductor. This is due to the relationship between strength of a compound semiconductor, that is, a member to be bonded, and a compression pressure required in a bonding process.

Many of compound semiconductors are more fragile and have lower strength than Si-based semiconductors. Therefore, when the bonding method of the present applicant is applied to bonding of a compound semiconductor, a compression pressure applied to the metal powder sintered compact in the bonding process needs to be set to a low pressure. In this respect, a pressure that a compound semiconductor can withstand is assumed, specifically, as 10 MPa or less, and preferably 5 MPa or less.

The bonding method of the present applicant is difficult to apply to bonding of a compound semiconductor because a low compression pressure is required as described above. In the bonding method of the present applicant, it is necessary, in the bonding process, to densify the metal powder sintered compact by compression deformation, and for this purpose, a prescribed or higher compression pressure is necessary. The compression pressure exceeds a pressure value that a compound semiconductor can withstand in many cases. Therefore, when the compression pressure employed in the bonding process is set to a low pressure for avoiding damage of the compound semiconductor, bonding strength becomes insufficient. Accordingly, it is determined that the bonding method of the present applicant using the metal paste and the metal powder sintered compact is difficult to be directly applied to bonding of a compound semiconductor.

Besides, for producing various semiconductor devices further downsized in recent years, a technique for efficiently performing die bonding of a semiconductor chip having a small bonding surface is necessary. Specifically, it is necessary, in a bonding member obtained after bonding, that dimensional accuracy in width, height and the like is excellent and is little varied among bonding members, and that a bonding material neither sticks out nor creeps up from a member to be bonded. A general metal paste cannot cope with such requirements. It is predicted that necessity of a bonding technique more excellent in bonding accuracy on a small bonding surface will increase in the future.

The present invention was made under these circumstances, and an object is to provide a bonding method capable of exhibiting effective bonding strength even on a member to be bonded having low strength, such as a compound semiconductor, and a bonding method having high bonding reliability. For this object, the present applicant discloses a novel conductive bonding material, a method for producing the same, and a bonding method, referring to the above-described conductive bonding material containing the metal powder sintered compact as the prior art.

Solution to Problem

In the conventional bonding process, a metal powder sintered compact corresponding to a bonding member is insufficient in bonding strength because deformation and densification thereof are insufficient. The present inventors presumed that this is because a compression target in the bonding process is a sintered compact of a metal powder. As described above, the sintered compact is formed by heating, at a prescribed or higher temperature, a laminate of a metal powder formed by applying a metal paste. During this heating process, the metal powder comes into contact with one another, and furthermore, thermal diffusion and necking occur, and thus, the metal powder sintered compact is increased in strength. The present inventors determined that the thus formed metal powder sintered compact has unexpectedly large deformation resistance, and hence cannot follow reduction of a compression pressure.

Therefore, the present inventors made examination on conductive bonding materials replaceable with the metal powder sintered compact, resulting in finding that a good bonding property can be obtained by using a molded article containing a dried product of an unsintered metal powder. Examinations were further made to find a dried product suitable for a conductive bonding material, and as a result, a molded article having a prescribed compressive deformation property was found.

Specifically, the present invention is drawn to a conductive bonding material containing a molded article of a metal powder, in which the metal powder is one or more selected from the group consisting of a gold powder, a silver powder, a platinum powder, and a palladium powder, and has a purity of 99.9% by mass or more, and an average particle size of 0.005 μm to 1.0 μm, and the conductive bonding material has a compressive deformation rate M, represented by the following expression, of 5% or more when compressed with a compression pressure of 5 MPa:

$$M=\{(h1-h2)/h1\}\times 100 \qquad \text{[Expression 1]}$$

wherein h1 represents an average thickness of the conductive bonding material before compression, and h2 represents an average thickness of the conductive bonding material after the compression.

As described above, the conductive bonding material of the present invention contains the molded article of the metal powder having prescribed purity/particle size. The molded article is formed by drying a metal paste described later under prescribed conditions, and is formed to be deformed to a prescribed extent when a low pressure load (5 MPa) is applied. Now, the present invention will be described in detail.

(A) Constitution of Conductive Bonding Material of Invention (A-1) Metal Powder

The metal powder contained in the conductive bonding material of the present invention is a metal powder of one or more metals selected from the group consisting of gold (Au), silver (Ag), platinum (Pt), and palladium (Pd), and having a purity of 99.9% by mass or more, and an average particle size of 0.005 μm to 1.0 μm.

The purity of the metal contained in the metal powder is required to be a high purity of 99.9% by mass or more for increasing plastic deformability of a metal particle. It is confirmed again through examination made in the present invention that the purity of the metal powder is significant. In the present invention, it is necessary to form a bonding portion densified similarly to a bulk metal from a molded article of a metal powder in an unsintered state. The high purity of the metal powder is an essential condition for causing plastic deformation under a low compression pressure in the bonding process.

When the purity of the metal powder is lowered to less than 99.9% by mass, hardness of the metal powder increases, plastic deformation of the metal particle itself is difficult to occur in the bonding process, and the compression deformation of the molded article is inhibited. In particular, when a low compression pressure is required, it is difficult to form a suitable bonding portion.

Besides, the average particle size of the metal powder is specified as 1.0 μm or less because a gap between particles is liable to be too large when a metal powder having a particle size larger than 1.0 μm is used as a conductive bonding material. When the gap within a conductive bonding material is large, densification is inhibited in the bonding process, and suitable bonding strength is difficult to obtain. On the other hand, the lower limit of the average particle size of the metal powder is specified as 0.005 μm because a particle smaller than this particle size easily aggregates when formed into a paste, and the compressive deformability in molding is liable to decrease. In addition, the constituent metal is limited to any one of gold, silver, platinum and palladium because these metals have good conductivity. It is noted that use of a mixture of a plurality of powders having different average particle sizes is not excluded in the present invention as long as the average particle sizes fall within the range of 0.005 μm to 1.0 μm.

(A-2) Molded Article of Metal Powder

The conductive bonding material of the present invention contains a molded article obtained by laminating the metal powder into a desired thickness. In this molded article, the metal powder particles are in contact with one another, but are not strongly bonded through necking and thermal diffusion as in a conventional metal powder sintered compact. The hardness of the respective metal powder particles is substantially the same as hardness thereof before being formed into the molded article. In order to obtain the molded article in such a state, the conductive bonding material of the present invention preferably contains a dried product obtained by drying the metal paste described later at a prescribed or lower temperature. When the molded article formed by drying and containing the metal powder having small thermal change is used, densification can be performed at a low pressure.

The conductive bonding material of the present invention is not particularly limited in the shape and the dimension. Regarding the shape, a flat plate shape is preferred in general. This is for the purpose of bonding a semiconductor chip and a substrate horizontally. As long as this purpose is not hindered, however, the flat plate may have irregularities on a bonding surface thereof. Besides, an outline shape of the flat plate is not especially limited, but may be in the shape of a rectangle, a circle, a polygon, or the like. Besides, the dimension and the thickness of the conductive bonding material can be appropriately set in accordance with a dimension of a member to be bonded (semiconductor chip) or a designed dimension of an electronic device in which the semiconductor chip is mounted.

(A-3) Compressive Deformation Rate

For the conductive bonding material of the present invention, a compressive deformation rate (M) corresponding to a deformation amount under a prescribed compression pressure is defined. In the present invention, the compressive deformation rate is defined for defining a state of the metal particle contained in the conductive bonding material. In a conventional conductive bonding material containing a sintered compact, deformation resistance is large because of thermal change of a metal particle and bonds among metal particles. The compressive deformation rate is defined for distinguishment from this state of the metal powder in the sintered compact.

The compressive deformation rate M defined in the present invention is calculated based on a thickness change caused in compressing the conductive bonding material with a pressure of 5 MPa and in accordance with the above-described Expression 1. The compression pressure used as a reference here is 5 MPa, and a value approximate to a compression pressure used in consideration of the aforementioned compound semiconductor (5 MPa to 10 MPa) is employed. In order to find a state enabling low pressure bonding, a pressure of about 5 MPa is preferably used as a reference. Besides, when a compression deformation rate under a compression pressure of 10 MPa or more is used for the definition, a sintered compact is liable to be embraced in the present invention, and hence, this definition intends to exclude such a bonding member difficult to deform. It is noted that a value measured at normal temperature is preferably employed in measurement of the compressive deformation rate.

In addition, the conductive bonding material of the present invention has a compressive deformation rate of 5% or more. When the compressive deformation rate is lower than 5%, deformation resistance is so large that a dense bonding portion is difficult to form unless a compression pressure is high. The numerical value of the compressive deformation rate is preferably 10% or more, and more preferably 15% or more. It is noted that a compressive deformation rate is in association with strength of the conductive bonding material. A conductive bonding material having an excessively high compressive deformation rate may collapse/deform by vibration or the like even under no compression. Therefore, in consideration of handleability of the conductive bonding material, the upper limit of the compressive deformation rate is preferably 30%.

(A-4) Relative Density

The conductive bonding material of the present invention has a relative density of preferably 50 to 80%. This is for accelerating movement and bonding of the metal particle when the conductive bonding material is pressed. A relative density refers to a value, expressed in percentage (%), obtained by dividing a true density of the metal by a measured density of the conductive bonding material (Relative density (%)=[(measured density of conductive bonding material)/(true density of metal)]×100).

It is noted that the relative density of the conductive bonding material of the present invention is in a range lower than that of a sintered compact, but may be a value overlapping with that of a sintered compact in some cases. For example, even a sintered compact of a metal powder may have a relative density of about 70%, and such a sintered compact cannot be distinguished from the present invention merely based on the relative density in some cases. This is because the relative density is a numerical value suggesting an amount of gaps among metal powder particles, and cannot indicate a close state or bonding state among the metal powder particles. In the conductive bonding material of the present invention, the metal powder particles are not or merely weakly bonded to one another, but are in a close state. The conductive bonding material of the present invention in such a state may have a high relative density. In other words, the conductive bonding material of the present invention is mainly distinguished based on the compressive deformation rate, and the relative density is an auxiliary physical property.

The conductive bonding material of the present invention having the above-described constitution is changed into a dense sintered compact due to thermal diffusion caused among the metal particles by heating after the bonding, and thus, a semiconductor chip and a substrate can be firmly bonded. Besides, the conductive bonding material of the present invention is a bonding member having adequate hardness with suppressing deformation resistance under compression. A semiconductor chip and the like can be accurately and highly precisely aligned in bonding. At this point, the bonding member minimally sticks out of the chip or creeps up on a side surface of the chip.

(B) Constitution of Bonding Member of Invention

The conductive bonding material of the present invention described so far can be used by singly fixing it on a member to be bonded such as a semiconductor chip to be bonded to a substrate or the like, but it is not efficient to singly handle a minute conductive bonding material. Therefore, one or more pieces of the conductive bonding material are formed on an appropriate base, and the conductive bonding material is handled together with the base material, and thus, the efficiency in the bonding process can be improved. In a bonding member of the present invention including the conductive bonding material and the base material, the pieces of the conductive bonding material are formed on the base material in dimension and number in accordance with the dimension and the number of members to be bonded.

As described above, the conductive bonding material of the present invention is not limited in the dimension. Therefore, for coping with a member to be bonded having a large bonding surface, a conductive bonding material having a large area may be formed, but it is flatness on its surface that becomes a problem at this point. As described later, the conductive bonding material of the present invention is formed by application and drying of a prescribed metal paste. It is, however, not easy to apply a flowable metal paste with highly precise flatness and in a large area. Regarding the conductive bonding material, it is a significant property to ensure the flatness for highly precisely bonding a semiconductor chip or the like.

Therefore, the present inventors conceived, as a method for ensuring the flatness of the conductive bonding material on the bonding member, that a bonding member on which a plurality of narrow pieces of the conductive bonding material are disposed at an appropriate interval is applied to obtain a flat conductive bonding material as a whole.

A suitable bonding member of the present invention is specifically a bonding member including, on a base material, a plurality of pieces of the conductive bonding material, in which an interval between the plurality of the pieces of the conductive bonding material is 1 μm to 10 μm, and each piece of the conductive bonding material has an aspect ratio R, represented by the following expression, of 1 or more and 100 or less.

$$R=\{(X+Y)/2\}/h1 \qquad \text{[Expression 2]}$$

wherein X represents a length of a short side of each piece of the conductive bonding material in a plane direction of the base material, Y represents a length of a long side of each piece of the conductive bonding material in the plane direction of the base material, and h1 represents an average thickness of the conductive bonding material before compression.

The bonding member of the present invention includes the pieces of the conductive bonding material having the prescribed aspect ratio disposed at a narrow interval. When the pieces of the conductive bonding material have the aspect ratio limited as described above, it is comparatively easy to make the surfaces (upper end surfaces) flat. When a plurality of pieces of the conductive bonding material having flat surfaces are disposed, and one of or a combination of a plurality of these are bonded to a member to be bonded, bonding flatness can be ensured.

Besides, when the conductive bonding material has the above-described aspect ratio, it is also easy to obtain a uniform thickness with the plurality of pieces of the conductive bonding material formed on the base material. Specifically, a tolerance of the thickness of the conductive bonding material on the base material can be set to ±10% or less of an average thickness of the pieces. It is not preferable that the thicknesses of the pieces of the conductive bonding material on the base material are varied. The conductive bonding material of the present invention is a dried product of a metal powder, and is compressed by compression performed in bonding to a member to be bonded. This compression absorbs a thickness difference between the pieces of the conductive bonding material adjacent to each other, and thus, a flat bonding portion averaged as a whole can be formed. When the thickness difference among the pieces of the conductive bonding material is excessively large, however, even the compression cannot sufficiently absorb the thickness difference, and hence flatness of a member to be bonded is impaired. The tolerance caused in the conductive bonding material having the aspect ratio defined in the present invention does no cause such a problem, and the flatness of a member to be bonded can be ensured. The constitution of the bonding member of the present invention will now be described in detail.

(B-1) Base

The base material is a member for supporting the conductive bonding material for efficient handling of the conductive bonding material. The material of the base material may be any material as long as it can temporarily hold the conductive bonding material. Examples include materials such as glass, quartz, silicon and ceramics. Besides, the shape and the dimension of the base material are not especially limited, and a flat plate in the shape of a rectangle, a circle, a polygon or the like can be applied.

(B-2) Metal Film

The bonding member of the present invention includes, between the conductive bonding material and the base material, at least one or more metal films. When this metal film is provided, adhesion between the conductive bonding material and the base material can be adjusted to ensure the handleability and bonding quality of the conductive bonding material. Specifically, owing to the metal film, the conductive bonding material can be prevented from falling off in handling the bonding member, and on the other hand, the conductive bonding material can be inhibited from remaining on the base material in peeling the conductive bonding material from the base material in the bonding process.

The material of the metal film is preferably one or more metals selected from the group consisting of gold (Au), silver (Ag), platinum (Pt), and palladium (Pd), and is preferably the same metal as that used in the conductive bonding material. These materials are selected for purposes of lowering resistance with increasing affinity between the metal film and the metal contained in the conductive bonding material. The material may be any pure metal or alloy as long as these purposes are not interfered.

The metal film can include a single layer, or a plurality of layers. When the metal film is formed as a plurality of layers, a combination of the same metal may be employed, or a combination of different metals may be employed. A layer of the metal film in contact with the conductive bonding material is, however, more preferably the same metal as that used in the conductive bonding material.

The thickness of the metal film is preferably 5 nm or more and 300 nm or less. When the thickness is less than 5 nm, the above-described effects cannot be sufficiently exhibited, and even when the thickness exceeds 300 nm, the effects do not differ but material cost increases. When the metal film is formed as a plurality of layers, a total thickness preferably falls within the above-described range.

The metal film is provided at least between the conductive bonding material and the base material. The metal film may be present only on a bottom surface of each piece of the conductive bonding material, or the metal film may be formed on the whole surface of the base material. Besides, the metal film may be present in a portion between the pieces of the conductive bonding material adjacent to each other. Furthermore, the metal film may be present at least on the bottom surface of each piece of the conductive bonding material, and the metal film may be formed on a side surface of the piece of the conductive bonding material.

(B-3) Plural Pieces of Conductive Bonding Material on Base

FIG. 1 schematically illustrates an example of the bonding member of the present invention. As described above, in the bonding member 1 of the present invention, a plurality of pieces of the conductive bonding material 2 are disposed on the metal film 11 above the base material 3 at an interval "d". The constitution of the conductive bonding material has been described above.

The size of the interval "d" between the plurality of pieces of the conductive bonding material is 1 to 10 μm. The size of the interval is 1 to 10 μm because an interval smaller than 1 μm is difficult to uniformly form, and when the interval is over 10 μm, it is difficult to make the resultant approximate to a conductive bonding material in the shape of a film as a whole. The size of the interval between the pieces of the conductive bonding material is more preferably 2 to 8 μm. It is noted that a maximum distance between the pieces of the conductive bonding material is adopted as the interval between the pieces of the conductive bonding material. Besides, the size of the interval is preferably uniform in the whole part, but may be partially different. The intervals having such different sizes, however, preferably fall within the above-described range.

In the bonding member of the present invention, as the shape of each piece of the conductive bonding material, the aspect ratio is 1 or more and 100 or less. The aspect ratio is calculated in accordance with the above-described Expression 2. When the pieces of the conductive bonding material having an aspect ratio less than 1 are set, the interval between the pieces of the conductive bonding material may be larger in some cases, and it is difficult to make the resultant approximate to a conductive bonding material in the shape of a film as a whole. Besides, a narrow piece of the conductive bonding material having an aspect ratio less than 1 is poor in stability, and may not be compressed as planned in transfer of the bonding member or compression in the bonding process. On the other hand, a wide piece of the conductive bonding material having an aspect ratio over 100 is difficult to ensure uniformity on the surface. The aspect ratio of the piece of the conductive bonding material is preferably 1 or more and 100 or less, more preferably 1 or more and 50 or less, and particularly preferably 1 or more and 10 or less. It is noted that there is no need for all the pieces of the conductive bonding material on the base material to have the same aspect ratio, but even when their aspect ratios are different, the aspect ratios of all the pieces of the conductive bonding material preferably fall within the above-described range.

It is noted, in the present invention, that the conductive bonding material is basically formed as individually separate pieces on the base material, but pieces of the conductive bonding material adjacent to each other may not be completely separated but may be partially linked as illustrated in FIG. 2.

(B-4) Use Mode of Conductive Bonding Material on Bonding Member

In the bonding member of the present invention, when the conductive bonding material provided on the base material is to be used for bonding a member to be bonded such as a semiconductor chip, the member to be bonded is once bonded and fixed (i.e. mounted) on the conductive bonding material as described later. At this time, in accordance with the dimension of the member to be bonded, one piece of the conductive bonding material, or a combination of a plurality of pieces of the conductive bonding material is used. For example, one piece of the conductive bonding material can be used for bonding one member to be bonded (i.e. semiconductor chip) as illustrated in FIG. 3(*i*), or a plurality of pieces of the conductive bonding material can be used for bonding one member to be bonded as illustrated in FIG. 3(*ii*). Besides, as illustrated in FIG. 3(*ii*), a plurality of members to be bonded having different sizes (as indicated by reference signs 4 and 4' in FIG. 3) can be fixed with one bonding member. It is noted, as illustrated in FIG. 3, that a width (indicated by W in FIG. 3) of a bonding surface in a combination of pieces of the conductive bonding material need not be always the same with respect to a width of the member to be bonded.

(C) Method for Producing Conductive Bonding Material of Invention

Next, a method for producing the conductive bonding material of the present invention will be described. A basic method for producing the conductive bonding material of the present invention includes a step of applying a metal paste on a base material, and a step of drying the metal paste to obtain a molded article. The respective steps will now be described.

(C-1) Preparation of Base

As a preparation process for the base material, a metal film is formed on the base material described above. For forming the metal film, an ordinary thin film forming process such as sputtering, vacuum evaporation, or chemical vapor deposition can be applied.

Alternatively, when a bonding member including a plurality of pieces of the conductive bonding material formed with the above-described aspect ratio and at the above-described interval is to be produced, a protective film such as a resist is preferably used for controlling these. Also when such a resist is used, a resist is applied as a preparation process to perform etching into a desired pattern of the conductive bonding material. In this case, the protective film such as a resist is not limited in properties thereof. Also for etching, a general method is applied. The metal film may be formed after applying/etching a resist, and before applying the metal paste. When a resist is covered with the metal film, a solvent contained in the metal paste can be inhibited from coming into direct contact with the resist, and damage of the resist otherwise caused by the solvent can be reduced.

(C-2) Application of Metal Paste

After the above-described preparation process, the metal paste is applied to the base material. The metal paste is configured as a slurry obtained by dispersing, in an organic solvent, one or more metal powders selected from the group consisting of a gold powder, a silver powder, a platinum powder and a palladium powder, and having a purity of 99.9% by mass or more and an average particle size of 0.005 μm to 1.0 μm. The organic solvent preferably has a boiling point of 200° C. or less. The boiling point of the organic solvent is specified to 200° C. or less because thus, a high temperature and long time are required for drying, and hence necking is formed between metal particles of the molded article to inhibit the metal particles from moving when pressed in bonding, resulting in lowering bonding strength.

The organic solvent usable in the present invention is preferably a branched saturated aliphatic dihydric alcohol or a monoterpene alcohol. More specifically, as the branched saturated aliphatic dihydric alcohol, propylene glycol, 1,2-butanediol, 1,3-butanediol, 1,2-pentanediol, 1,3-pentanediol, 1,4-pentanediol, 1,5-pentanediol, 2,3-pentanediol, 2,4-pentanediol, 1,2-hexanediol, 1,3-hexanediol, 1,4-hexanediol, 1,5-hexanediol, 1,6-hexanediol, 2,4-diethyl-1,5-pentanediol, and derivatives or the like of these can be used. Besides, as the monoterpene alcohol, citronellol, geraniol, nerol, menthol, terpineol (α, β), carveol, twill alcohol, pinocampheol, β-phenethyl alcohol, dimethyloctanol, hydroxycitronellol, 2,4-diethyl-1,5-pentanediol, trimethylpentanediol monoisobutyrate, and derivatives of these can be used. Besides, as a chain saturated hydrocarbon, pentane, hexane, heptane, octane, nonane, decane, undecane, dodecane, and derivatives thereof are used. Alternatively, a compound obtained through a condensation reaction of monovalent carboxylic acid and polyhydric alcohol is effective, and examples include triethylene glycol/di-2-ethylhexanoate, and triethylene glycol/di-2-ethylbutanoate. It is noted that the boiling point of an organic solvent is liable to depend on the number of carbon atoms thereof, and hence, the solvent to be applied preferably has 5 to 20 carbon atoms. From this point of view, the solvent may be an aromatic hydrocarbon, and for example, terpineol, methanol, and alkylbenzene used as a solvent for a thick film paste do not have functional problems. As the organic solvent, one organic solvent may be applied, or a mixture of two or more organic solvents having different boiling points may be applied. When the organic solvent contains solvents respectively having a low boiling point and a high boiling point, the organic solvent having a low boiling point can be removed by vaporization in a treatment for adjusting a content of the metal particle, and thus the adjustment can be eased.

A method for applying the metal paste on a base material is not especially limited, and for example, various methods such as a spin coating method, a screen printing method, an inkjet method, and blade coating can be employed in accordance with the size of the base material. The application of the metal paste can be performed at normal temperature and normal pressure. The application may be performed, however, under a reduced pressure atmosphere. In particular, when the metal paste is applied on the base material having a resist pattern formed thereon, the application is performed preferably under a reduced pressure atmosphere for sufficiently filling the metal paste in pores.

(C-3) Drying Process

Next, the applied metal paste is dried to obtain a dried product. This drying process is a significant process for forming a molded article of the metal powder by heating the metal paste without compression with vaporizing/removing the organic solvent contained in the paste. Although a drying process is an optional process in a conventional bonding method in which a metal powder sintered compact is applied, this is an essential process in the present invention.

As treatment conditions for the drying process, a drying temperature is less than 100° C. When the treatment is performed at a high temperature beyond this temperature, the metal powder is sintered even without compression, and hence a compressive deformation rate is lowered, which state is not suitable for bonding at a low pressure. The drying temperature is preferably 65° C. or less, and more preferably 60° C. or less. A lower limit of the drying temperature may be any temperature equal to or higher than a temperature at which the organic solvent can vaporize. In order to efficiently form a molded article having a suitable compressive deformation rate, however, the temperature is preferably 20° C. or more. A drying time in the drying process is preferably 0.1 hours or more and 1 hour or less. The drying time is set in accordance with the drying temperature, and when the drying is performed at a high temperature, the drying time can be short.

It is noted that the drying process under the above-described conditions is an essential process in forming the conductive bonding material from the metal powder, and a preliminary drying treatment may be performed prior to the drying process. The drying process of the present invention is performed under comparatively thermally mild conditions, and hence the solvent can be usually removed without destroying alignment of the metal powder in the metal paste. Even under the above-described drying conditions, however, vaporization of the solvent and disappearance of bubbles present inside the metal paste can ununiformly occur depending on the content of the metal powder in the metal paste and the application state. In such a case, the flatness on the surface of the dried product is impaired, and a planned shape may not be obtained. Therefore, the preliminary drying treatment is performed prior to the drying process so as to vaporize the solvent more gently, and thus, the shape of the dried product can be accurately controlled through the following drying process. As conditions for the preliminary heating treatment, it is preferable that a treatment atmosphere is a vacuum atmosphere of 1 Pa to 10 kPa, and that a temperature is 10° C. to 30° C. This preliminary drying treatment is a useful treatment for drying the metal paste filled in pores formed from a resist.

(C-4) Post-Process (Optional Process)

Through the above-described drying process, the conductive bonding material and the bonding member of the present invention can be produced. When a resist or the like is applied/etched into a pattern on the base material, the resist is removed after the drying process. For this post-process, a general method can be applied. When the resist is removed, the bonding member on which the pieces having a suitable aspect ratio of the conductive bonding material are disposed at the prescribed interval can be obtained.

Besides, the conductive bonding material resulting from the drying process can be cut by appropriate means to obtain a conductive bonding material in arbitrary shape and size. The cutting of the conductive bonding material is useful for the bonding member produced by applying and drying the metal paste on the base material without using a resist or the like. For example, a single piece of the conductive bonding material is formed on the base material, and the resultant is cut into a plurality of pieces of the conductive bonding material.

In cutting the conductive bonding material, laser processing is preferably employed. The dried product of the metal powder has given strength, but is still fragile as compared with a sintered compact and a bulk material, and hence, it is difficult to cut by usual machine cutting or shearing. When fusing by laser processing is employed, the conductive bonding material can be cut without destroying it. It is noted that the cutting of the conductive bonding material can be performed even when the conductive bonding material is produced using a resist as described above.

(D) Bonding Method of Invention

Next, a method for bonding a semiconductor chip with the bonding member including the conductive bonding material of the present invention will be described. The bonding method with the bonding member of the present invention includes two bonding methods, a first bonding method and a second bonding method. The respective bonding methods will now be described in detail.

(D-1) First Bonding Method of Invention

In the first bonding method with the bonding member of the present invention, the conductive bonding material is compressed to be mounted (fixed) on a semiconductor chip, that is, a member to be bonded, and then the semiconductor chip is placed on a substrate, that is, a bonding target, and compressed to be bonded. Thus, the semiconductor chip is bonded to the substrate via the conductive bonding material.

Specifically, the first bonding method of the present invention is a method for bonding a semiconductor chip to a substrate using the bonding member described above, and includes a step of mounting the conductive bonding material on the semiconductor chip by compression and heating with the semiconductor chip placed on the conductive bonding material disposed on the bonding member, and a step of bonding the semiconductor chip to a substrate by compression and heating with the semiconductor chip having the conductive bonding material mounted thereon placed on the substrate. The details of the first bonding method will be described with an example illustrated in FIG. 4. FIG. 4 is a diagram for explaining a semiconductor chip bonding process with a bonding member including a plurality of pieces of the conductive bonding material formed on a base material.

(D-1-1) Mounting of Conductive Bonding Material on Semiconductor Chip

The bonding member is prepared (FIG. 4(*i*)), and a semiconductor chip having a prescribed dimension is placed and fixed on the conductive bonding material disposed on the base material (FIG. 4(*ii*)). For this fixing, it is necessary to compress and heat the conductive bonding material via the semiconductor chip. As conditions for fixing the conductive bonding material, a compression pressure is preferably 2 MPa or more and 5 MPa or less. Besides, a heating temperature is preferably 40° C. or more and 100° C. or less. A bonding force between the conductive bonding material and the semiconductor chip in this process is set to be larger than a bonding force between the metal film and the base material (such as glass, silicon or the like). Besides, it is not preferable that the metal powder contained in the conductive bonding material is excessively deformed or sintered. The above-described conditions are set in consideration of this point.

The semiconductor chip to which the bonding method of the present invention is applied is not especially limited. The present invention is particularly useful for bonding of a compound semiconductor, but is not limited thereto. A conventional Si-based semiconductor chip can also receive the benefits of the present invention.

It is noted that a metal film may be formed on a bonding surface of the semiconductor chip. When a metal film is formed also on the semiconductor chip, adhesion with the conductive bonding material is improved. The metal film preferably contains any one of Au, Ag, Pt, and Pd, and more preferably contains the same type of the metal as that used in the conductive bonding material.

(D-1-2) Pick Up of Semiconductor Chip

After the compression, the semiconductor chip is picked up from the base material, and thus, a semiconductor chip on which the conductive bonding material is fixed can be obtained (FIG. 4(*iii*)).

(D-1-3) Bonding of Semiconductor Chip on Substrate

The semiconductor chip on which the conductive bonding material is fixed as described above is placed on a substrate, that is, a bonding target (FIG. 4(*iv*)). After placing, the resultant is compressed and heated to bond the semiconductor chip to the substrate (FIG. 4(*v*)). In this bonding process, plastic deformation of the metal powder contained in the conductive bonding material is accelerated mainly by compression for densification, and thus, bonding strength is attained.

The substrate to which the semiconductor chip is bonded is not limited in the material and the shape/dimension. As described above, the present invention is applicable to a resin-based organic substrate, but is not limited thereto. The present invention is useful also for a substrate (wafer) of a Si-based material, a ceramic substrate and the like.

Besides, a single layer or a plurality of layers of a metal of at least any one of Au, Ag, Pt, Pd, Ti, Cr, Cu and Ni may be formed precedently on the substrate. When a metal film is formed on the substrate, bonding strength between the conductive bonding material and the substrate can be further improved. In addition, the metal film may function as an electrode, a wire or the like of a device in some cases. When the metal film is provided, the thickness is preferably 0.1 μm or more and 1 μm or less in total.

The compression pressure employed in the bonding process is set in consideration of a pressure that the semiconductor chip to be compressed can withstand. When the semiconductor chip has comparatively high strength like a Si-based semiconductor chip, the bonding can be performed under a compression pressure of 30 MPa or less. On the other hand, in bonding a compound semiconductor chip many of which have low strength and are fragile, the compression pressure is preferably 10 MPa or less, and particularly preferably 5 MPa or less. A lower limit of the compression pressure does not depend on the type of semiconductor chip, but is preferably 2 MPa or more. When the pressure is less than 2 MPa, the deformation of the metal powder is difficult to proceed, and a bonding portion cannot be densified.

The heating in the bonding process is performed mainly for the purpose of increasing plastic deformability of the metal powder to assist densification by compression. This heating is expected to cause sintering of the metal powder to proceed in a part or the whole of the conductive bonding material. The heating temperature is preferably 80° C. or more and 300° C. or less. When the temperature is less than 80° C., the plastic deformability of the metal particle cannot be increased, and hence firm bonding cannot be obtained. Besides, when the temperature exceeds 300° C., the semiconductor chip and the substrate may be damaged.

It is noted that the heating temperature is set in consideration of heat resistant temperatures of the semiconductor chip and the substrate. For example, in a resin-based organic substrate, when the temperature is beyond the glass transition temperature (Tg), physical properties such as mechanical strength and a dielectric constant are liable to largely change. The heating temperature for such a substrate having low heat resistance is preferably 230° C. or less, and more preferably 200° C. or less. The present invention can contribute not only to reduction of the compression pressure in the bonding process but also to reduction of the heating temperature. It is noted that the conductive bonding material is heated from one of or both of a semiconductor chip side and a substrate side. It is preferable that heating temperature from either side falls within the above-described range.

The compression and heating time employed in the bonding process is preferably 0.5 seconds or more and 120 seconds or less. When the time is less than 0.5 seconds, sufficient bonding strength cannot be obtained, and even when the compression is performed for more than 120 seconds, further densification cannot be expected. In the present invention, however, the conductive bonding material having deformability is applied in the bonding process, and hence, the compression and the heating are sufficient when performed for a shorter time than in a conventional method (metal powder sintered compact). Specifically, the time may be 10 seconds or less, or 5 seconds or less.

(D-1-4) Post-Heat Treatment (Post Sintering)

Through the above-described bonding process, the conductive bonding material is in a sufficiently compressively deformed state, and the semiconductor chip is in a state bonded to the substrate. The bonding may be completed in this state, but for attaining higher bonding strength, the conductive bonding material is preferably heated after the bonding process. This post-heating treatment is a treatment performed mainly for the purpose of sintering (post sintering) the metal powder. Through this treatment, gaps within the conductive bonding material can be eliminated for further densification. Since the bonding process is a treatment performed mainly by compression of a short time, the time of the heating simultaneously performed is also short. Therefore, it is not that sintering does not proceed at all but sintering sufficient for eliminating gaps does not occur in the bonding process. Accordingly, the heat treatment is additionally performed after the bonding process to cause the sintering to proceed.

The heating temperature for thus sintering the conductive bonding material is preferably 100° C. or more and 300° C. or less. When the temperature is less than 100° C., the sintering and densification cannot be expected to proceed. When the temperature exceeds 300° C., the sintering excessively proceeds, resulting in a state where the bonding portion alone is too hard. This heating temperature is also set in consideration of the heat resistant temperatures of the semiconductor chip and the substrate. Therefore, the heating temperature for a substrate having low heat resistance such as a resin-based organic substrate is preferably 230° C. or less, and more preferably 200° C. or less.

The heating time of the post sintering is preferably 10 minutes or more and 120 minutes or less. The sintering cannot be completed in less than 10 minutes, and even when the heating is performed for more than 120 minutes, further densification cannot be expected. It is noted that this heat treatment for sintering may be performed without compression, or with compression. When the compression is performed, a pressure is preferably 10 MPa or less.

Through the above-described bonding method and the optional process of post sintering described above, the semiconductor chip is firmly bonded to the substrate.

(D-II) Second Bonding Method of Invention

Next, the second bonding method with the bonding member of the present invention will be described. In the second bonding method with the bonding member of the present invention, the conductive bonding material is compressed to be mounted (fixed) on a substrate, that is, a bonding target of a semiconductor chip, and the semiconductor chip is placed on a metal film disposed on the conductive bonding material mounted on the substrate, and the resultant is compressed to be bonded. In this manner, the semiconductor chip is bonded to the substrate via the conductive bonding material.

Specifically, the second bonding method of the present invention is a method for bonding a semiconductor chip to a substrate using the above-described bonding member, and includes a step of mounting the conductive bonding material on the substrate by compression and heating with the substrate placed on the conductive bonding material disposed on the bonding member, and a step of bonding a semiconductor chip to the substrate by compression and heating with the semiconductor chip placed on the metal film disposed on the conductive bonding material mounted on the substrate. The details of the second bonding method will be described with an example illustrated in FIG. 5. FIG. 5 is a diagram for explaining a semiconductor chip bonding process with the bonding member including a plurality of pieces of the conductive bonding material formed on the base material.

(D-II-1) Mounting of Conductive Bonding Material on Substrate

The bonding member is prepared (FIG. 5(*i*)), and a substrate having a prescribed dimension is placed and fixed on the conductive bonding material disposed on the base material (FIG. (*ii*)). For this fixing, it is necessary to compress and heat the conductive bonding material via the substrate. As conditions for fixing the conductive bonding material, the compression pressure is preferably 2 MPa or more and 5 MPa or less. Besides, the heating temperature is preferably 40° C. or more and 100° C. or less. A bonding force between the conductive bonding material and the substrate in this process is set to be larger than a bonding force between the metal film and the base material (glass, silicon or the like). Besides, it is not preferable that the metal powder contained in the conductive bonding material is excessively deformed or sintered. The above-described conditions are set in consideration of this point.

It is noted that the substrate is not limited in the material and the shape/dimension. As described above, the present invention is applicable to a resin-based organic substrate, but is not limited thereto. The present invention is useful also for a substrate (wafer) of a Si-based material, a ceramic substrate and the like.

Besides, a single layer or a plurality of layers of a metal of at least any one of Au, Ag, Pt, Pd, Ti, Cr, Cu and Ni may be formed precedently on the substrate. When a metal film is formed on the substrate, bonding strength between the conductive bonding material and the substrate can be further improved. In addition, the metal film may function as an electrode, a wire or the like of a device in some cases. When the metal film is provided, the thickness is preferably 0.1 μm or more and 1 μm or less in total.

(D-II-2) Pick Up of Substrate

After the compression, the substrate is picked up from the base material, and thus, a substrate on which the conductive bonding material is fixed can be obtained (FIG. 5(*iii*)).

(D-II-3) Bonding Between Substrate and Semiconductor Chip

The substrate on which the conductive bonding material is fixed as described above is optionally reversed, and the semiconductor chip is placed on the metal film disposed on the conductive bonding material (FIG. 5(*iv*)). After the placing, the resultant is compressed and heated to bond the semiconductor chip to the substrate (FIG. 5(*v*)). In this bonding process, plastic deformation of the metal powder contained in the conductive bonding material is accelerated mainly by compression for densification, and thus, bonding strength is attained.

It is noted that a metal film may be precedently formed on a bonding surface of the semiconductor chip separately from the metal film formed on the conductive bonding material. When the metal film is formed also on the semiconductor chip, affinity with the metal film formed on the conductive bonding material is improved. The metal film precedently formed on the bonding surface of the semiconductor chip contains preferably any one of Au, Ag, Pt, and Pd, and more preferably the same type of the metal used in the metal film formed on the conductive bonding material.

Besides, the semiconductor chip to which the bonding method of the present invention is applied is not especially limited. The present invention is particularly useful for bonding a compound semiconductor, but is not limited thereto. A conventional Si-based semiconductor chip can also receive the benefits of the present invention.

In addition, regarding the compression pressure, the heating, and the compression and heating time employed in the bonding process, a pressure of 2 MPa or more and 30 MPa or less, heating at 80° C. or more and 300° C. or less, and compression and heating time of 0.5 seconds or more and 120 seconds or less are preferred. Specifically, these are the same as those employed in the first bonding method described above.

(D-II-4) Post-Heat Treatment (Post Sintering)

Through the above-described bonding process, the conductive bonding material is in a sufficiently compressively deformed state, and the semiconductor chip is in a state bonded to the substrate. The bonding may be completed in this state, but for attaining higher bonding strength, for the same reason as described in the first bonding method above, post sintering may be optionally performed under conditions of the heating temperature (100° C. or more and 300° C. or less), the heating time (10 minutes or more and 120 minutes or less), and the pressure (10 MPa or less).

Through the above-described bonding method and the optional process of post sintering described above, the semiconductor chip is firmly bonded to the substrate.

Advantageous Effects of Invention

As described so far, according to a conductive bonding material of the present invention, the temperature and the pressure employed in bonding are reduced, and at the same time, sufficient bonding strength can be obtained. Besides, a bonding method using a bonding member of the present invention can firmly bond a semiconductor chip to a substrate. Besides, the bonding member and the bonding method therefor of the present invention is suitable for die bonding a minute semiconductor chip.

DETAILED DESCRIPTION OF THE PREFERRED EMBODIMENTS

Figure 1:
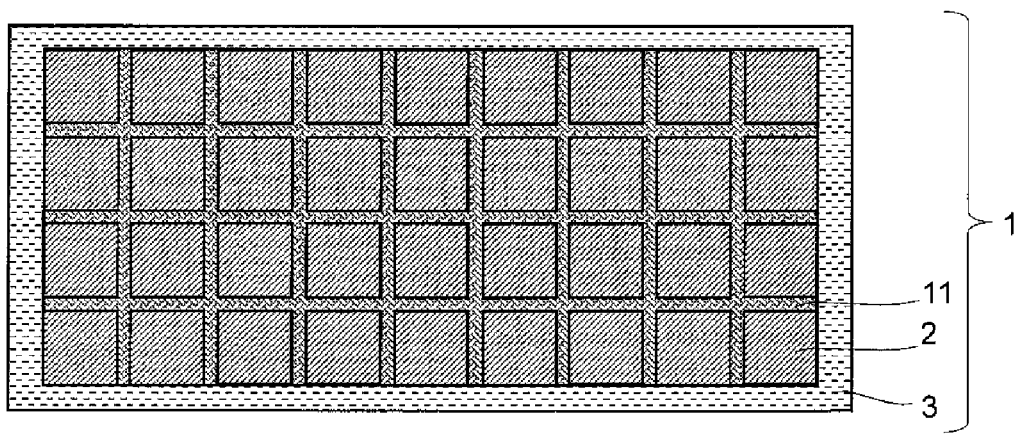
FIG. 1 is a diagram illustrating an example of the appearance and cross section of a bonding member of the present invention.
Figure 1:
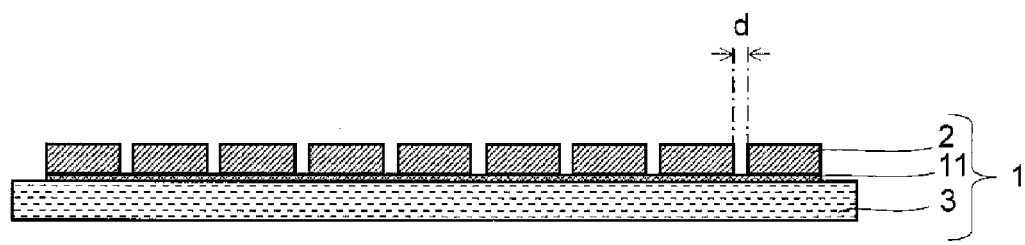
Figure 2:
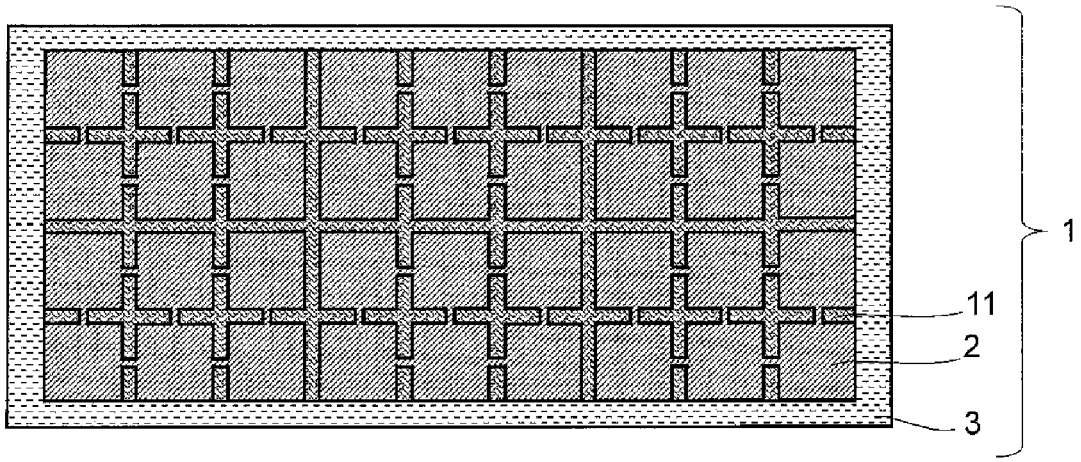
FIG. 2 is a diagram illustrating another example of the appearance of the bonding member of the present invention.
Figure 3:
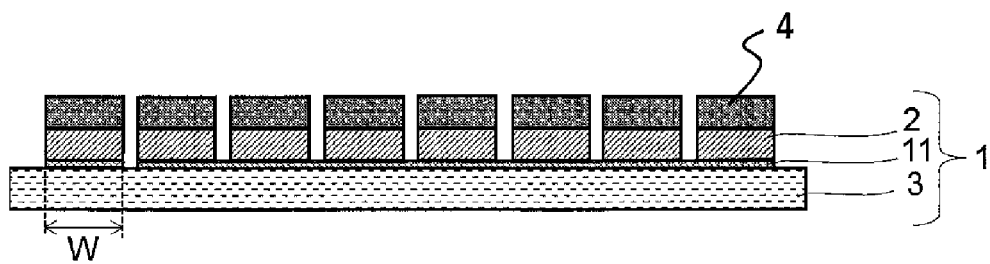
FIG. 3 is a diagram illustrating examples of a use mode of a conductive bonding material disposed on the bonding member of the present invention.
Figure 3:
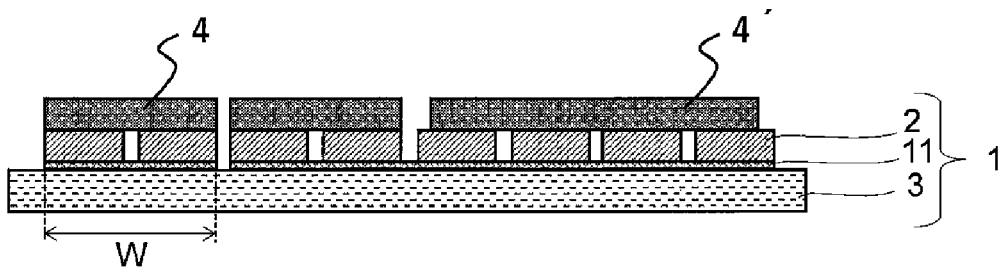

First Embodiment: An embodiment of the present invention will now be described. In the present embodiment, a conductive bonding material and a bonding member were produced by preparing a metal paste with a gold powder used as a metal powder. Then, the bonding member was used to perform a semiconductor chip bonding test.

[Production and Evaluation of Conductive Bonding Material]

A gold powder (average particle size: 0.3 µm) produced by a wet reduction method and having a purity of 99.99% by mass was mixed with tetrachloroethylene (product name; ASAHI PERCHLOR) used as an organic solvent to prepare a metal paste (gold paste). The content of the gold powder in the gold paste was set to 90% by mass. It is noted that the purity of the gold powder was quantitatively analyzed with an ICP emission spectrometer. Besides, the particle size of the gold powder was obtained based on an average value of a major axis and a minor axis of a gold particle resulting from image analysis of an observation image (5000×) obtained with a scanning electron microscope (SEM). The particle sizes of 100 gold particles were measured to calculate the average particle size.

Next, a gold film with a thickness of 50 nm was formed by sputtering on a base material as a metal film. Then, the gold paste was applied on the metal film disposed on the base material. As the base material, a glass wafer (diameter ϕ: 100 mm, thickness: 0.5 mm) TEMPAX Float® manufactured by SCHOTT was used. As a method for applying the metal paste, a blade coating method in which the gold paste was dropped on the metal film disposed on the base material to be spread with a spatula in a vacuum chamber (35 kPa) was employed.

After applying the gold paste on the metal film disposed on the base material, the metal paste was dried to obtain a dried product to be contained in a conductive bonding material. This drying process was performed by heating the metal paste to a prescribed temperature in a drying furnace (air atmosphere) for drying. The drying temperature was 20° C. (Example 1), 40° C. (Example 2), 60° C. (Example 3), 65° C. (Example 4), 70° C. (Example 5), and 120° C. (Comparative Example 1). The drying time was 10 minutes. The drying conditions of each example are shown in Table 1. The dried product resulting from the drying had a thickness of 20 µm to 25 µm.

Then, a gold film containing the thus obtained dried product and the metal film were cut by laser processing to obtain a conductive bonding material. For the laser processing, a picosecond hybrid laser (LDH-G2510 manufactured by Spectronix, wavelength: 532 nm, pulse width: <15 ps) was used as a laser oscillator. The processing conditions were set to an output of 1.8 W, a spot size of 18 µmϕ, a frequency of 1 MHz, a moving distance per pulse of 2 µm, and a cutting speed of 2000 mm/s. In the present embodiment, the gold film was cut into a grid pattern (each section: 1 mm×1 mm). Besides, the cutting was performed with the number of repeating the irradiation of 15 times. The dimension of each conductive bonding material obtained by the cutting was 2.75 mm square. Besides, each conductive bonding material had a thickness within a range of 20 to 25 µm.

[Observation of Conductive Bonding Material and Measurement of Compressive Deformation Rate]

Figure 6:
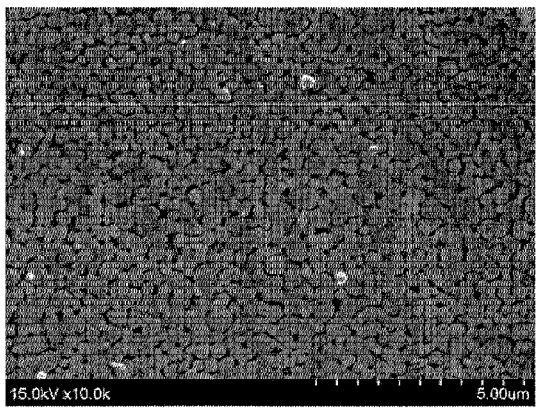
FIG. 6 illustrates SEM images of a front surface (on an application surface side) and a back surface (on a base material side) in a surface layer cross section of a conductive bonding material of Example 1 of First Embodiment.
Figure 6:
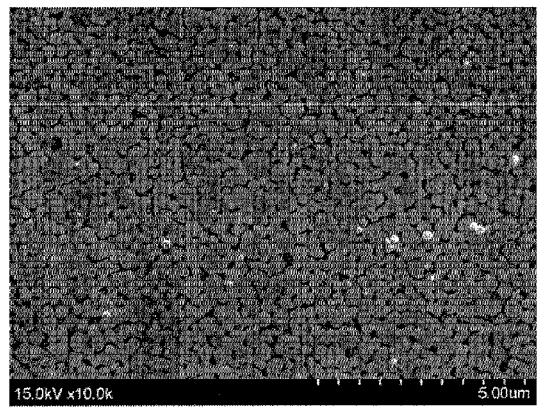

Detailed appearance observation and measurement of a compressive deformation rate were performed on each conductive bonding material produced in Examples and Comparative Example. FIG. 6 illustrates SEM images (10000×) of a front surface (on an application surface side) and a back surface (on a base material side) in a surface layer cross section of the conductive bonding material of Example 1. As illustrated in FIG. 6, the metal powder was little deformed, and necking was not caused among particles in the conductive bonding material.

Next, the compressive deformation rate, against the drying temperature, of the conductive bonding material was measured. As a method for measuring the compressive deformation rate, a thickness change, in each conductive bonding material of Examples and Comparative Example, caused between before and after compression was measured. Specifically, in a conductive bonding material having a metal film formed thereon before compression, the thickness of a compression surface was measured in three points with a micrometer to calculate an average value, and thus, an average thickness (h1) before compression was measured. Thereafter, a compression pressure of 5 MPa was applied onto an area of the compression surface at room temperature of 20° C. with a flip chip bonder. After removing the pressure, the thickness was measured with a micrometer in three points the same as the measurement points for the h1 to calculate an average value, and thus, an average thickness (h2) after compression was measured. Then, based on Expression 1 described above, the compressive deformation rate was obtained. Measurement results of the compressive deformation rate are shown in Table 1.

TABLE 1

| No. | Drying Temperature (° C.) | Drying Time (min) | Compressive Deformation Rate (%) |
|---|---|---|---|
| Example 1 | 20 | 10 | 25 |
| Example 2 | 40 | 10 | 24 |
| Example 3 | 60 | 10 | 20 |
| Example 4 | 65 | 10 | 13 |
| Example 5 | 70 | 10 | 10 |
| Comparative Example 1 | 120 | 10 | 3 |

It is understood from Table 1 that the compressive deformation rate is basically liable to reduce as the drying temperature increases. In the sample dried at 120° C. (Comparative Example 1), however, the compressive deformation rate was definitely low. On the contrary, in the conductive bonding materials of Examples, definite compressive deformation was caused even with a compression pressure of 5 MPa.

[Bonding Test for Bonding Member by First Bonding Method]

Next, the bonding member of each of Examples and Comparative Example was used to perform a bonding test for bonding a semiconductor chip (GaN) to a substrate (Si). In the present embodiment, the conductive bonding material had a dimension of a thickness of 50 μm×2.75 mm square, the semiconductor chip had a dimension of a thickness of 0.525 mm×2 mm square, and the Si substrate had a dimension of a thickness of 0.75 mm×10 mm square. It is noted that bonding surfaces of the semiconductor chip and the Si substrate were precedently plated, as an intermediate layer, with Ti (thickness: 50 nm), Pt (thickness: 50 nm) and Au (thickness: 300 nm).

Figure 4:
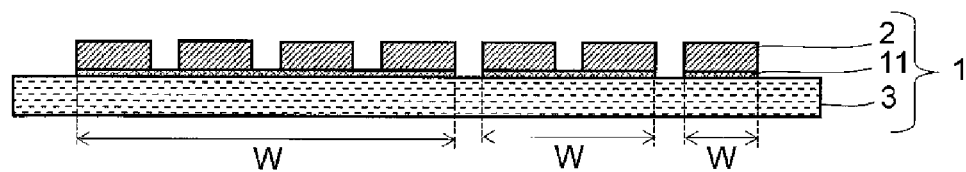
FIG. 4 is a schematic diagram illustrating a first bonding method using the bonding member of the present invention.
Figure 4:
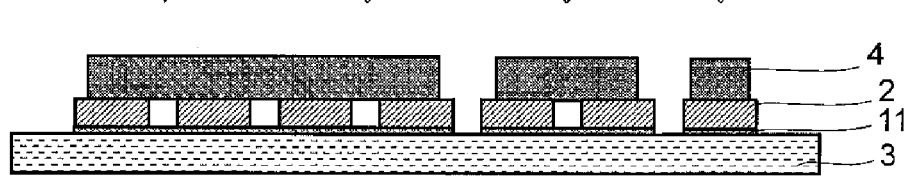
Figure 4:
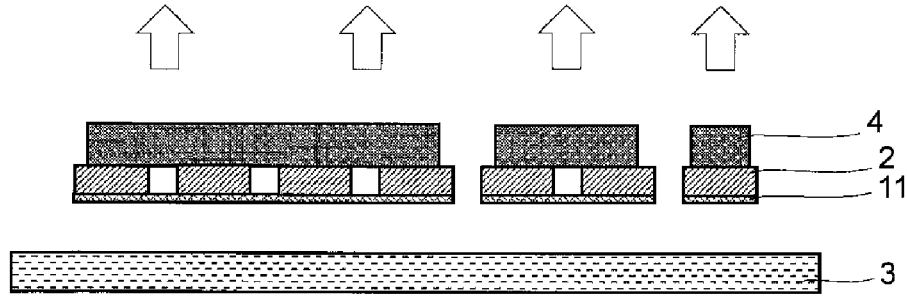
Figure 4:
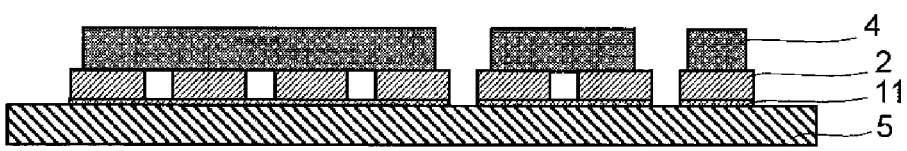
Figure 4:
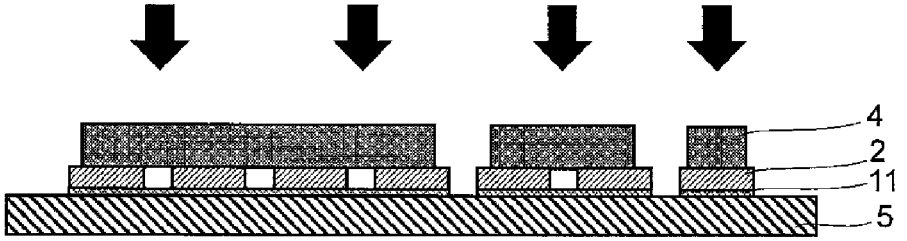

A method for bonding the semiconductor chip was performed through similar procedures to those of the first bonding method illustrated in FIG. 4. First, the semiconductor chip was placed on the conductive bonding material, and compressed and heated to mount the conductive bonding material on the semiconductor chip. As conditions for this mounting, the mounting was performed at a compression pressure of 2.5 MPa and a temperature of 100° C.

Next, the semiconductor chip having the conductive bonding material mounted thereon was picked up from the base material, and was placed on the substrate, and the semiconductor chip was bonded to the substrate by applying a pressure for 5 seconds under heating. Heating conditions in the bonding process were 200° C. on a Si substrate side and 100° C. on a semiconductor chip side. Compressing conditions were set to two types, 5 MPa and 10 MPa, and either pressure was applied for 5 seconds.

After the bonding process, a heat treatment was performed for post sintering of the bonded conductive bonding material. The post sintering was performed with a drying furnace under conditions of heating to 200° C. for 60 minutes in the air without compression.

After the semiconductor chip was bonded through these processes, bonding strength of the conductive bonding material was measured. This evaluation was performed by using shearing strength. The shearing strength was set as a value obtained by dividing, by the area of the semiconductor chip (2 mm square), a shear load measured with a die shear measuring apparatus at a shear rate of 100 μm/s and a step back interval of 100 μm. Results are shown in Table 2.

TABLE 2

| | Drying | Compressive | Shear Strength (MPa) | |
|---|---|---|---|---|
| No. | Temperature (° C.) | Deformation Rate (%) | Test Pressure: 5 MPa | Test Pressure: 10 MPa |
| Example 1 | 20 | 25 | 36 | 42 |
| Example 2 | 40 | 24 | 35 | 41 |
| Example 3 | 60 | 20 | 30 | 35 |
| Example 4 | 65 | 13 | 28 | 33 |
| Example 5 | 70 | 10 | 27 | 32 |
| Comparative Example 1 | 120 | 3 | 15 | 25 |

It is understood from Table 2 that when the compression pressure was set to as low as 5 MPa in using the conductive bonding material having a low compressive deformation rate less than 5% as in Comparative Example 1, the shear strength did not reach even 20 MPa. In Comparative Example 1, when the compression pressure was increased to 10 MPa, shear strength more than 20 MPa could be obtained. On the contrary, when the compressive deformation rate was increased by drying at a low temperature as in the conductive bonding materials of Examples, effective bonding strength could be obtained through compression with a low pressure. In this manner, the conductive bonding material of the present invention can obtain sufficient bonding strength simultaneously with reducing both the temperature and the pressure employed in bonding.

[Bonding Test for Bonding Member by Second Bonding Method]

Next, the bonding member of each of Examples and Comparative Example was used to perform a bonding test for bonding a semiconductor chip (GaN) to a substrate (Si) by the second bonding method. The same substrate and semiconductor chip as those used in the first bonding method were used.

Figure 5:
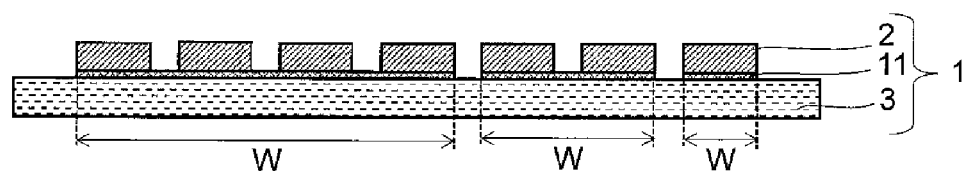
FIG. 5 is a schematic diagram illustrating a second bonding method using the bonding member of the present invention.
Figure 5:
Figure 5:
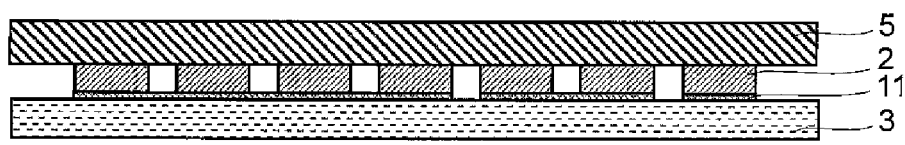
Figure 5:
Figure 5:
Figure 5:
Figure 5:
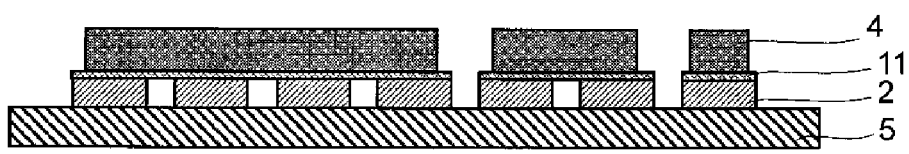
Figure 5:
Figure 5:
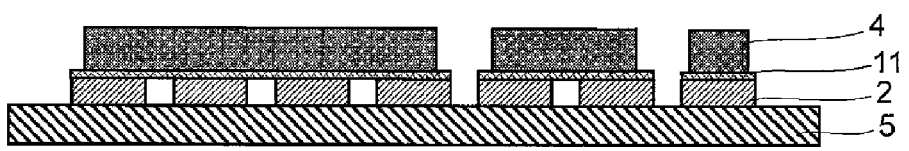

A method for bonding the semiconductor chip was performed through similar procedures to those of the second bonding method illustrated in FIG. 5. First, the substrate was placed on the conductive bonding material, and was compressed and heated to mount the conductive bonding material on the substrate. As conditions for this mounting, the mounting was performed at a compression pressure of 2.5 MPa and a temperature of 100° C.

Next, the substrate having the conductive bonding material mounted thereon was picked up from the base material and reversed, the semiconductor chip was placed on the metal film disposed on the conductive bonding material, and the semiconductor chip was bonded to the substrate by applying a pressure for 5 seconds under heating. Heating conditions in the bonding process were 200° C. on a Si substrate side and 100° C. on a semiconductor chip side. Compressing conditions were set to two types, 5 MPa and 10 MPa, and either pressure was applied for 5 seconds.

After the bonding process, a heat treatment was performed for post sintering of the bonded conductive bonding material. The post sintering was performed with a drying furnace under conditions of heating to 200° C. for 60 minutes in the air without compression.

After the semiconductor chip was bonded through these processes, bonding strength of the conductive bonding material was measured. This evaluation was performed by using shearing strength. The shearing strength was set as a value obtained by dividing, by the area of the semiconductor chip (2 mm square), a shear load measured with a die shear measuring apparatus at a shear rate of 100 μm/s and a step back interval of 100 μm. As a result, in employing the second bonding method, shear strength equivalent to the results shown in Table 2 obtained by the first bonding method described above was obtained. It was confirmed based on these results that also in employing the second bonding method, the conductive bonding material of the present invention can obtain sufficient bonding strength simultaneously with reducing both the temperature and the pressure employed in bonding.

Second Embodiment: In the present embodiment, metal pastes were prepared from a plurality of types of metal powders having different compositions and particle sizes to produce conductive bonding materials. Specifically, metal powders of not only gold but also platinum, silver and palladium were used. All of these metal powders were commercially available high purity metal powders produced by a wet reduction method. It is noted that a low purity gold powder (98%) was applied in a part of this examination. As for this gold powder, gold bullion containing a slight amount of an impurity metal was used as a raw material in the wet reduction method.

The contents of a solvent and a metal powder in each metal paste were the same as those of First Embodiment. The drying temperature after applying the metal paste on the base material was 60° C. (or 65° C. in some samples), and the drying time was 10 minutes. After drying the metal paste, laser processing was performed under the same conditions as those employed in First Embodiment to produce the conductive bonding material in the same size.

Then, the various conductive bonding materials thus produced were used to perform a bonding test for a semiconductor chip. The semiconductor chip and a substrate used here were the same as those used in First Embodiment. Besides, the bonding conditions were the same as those employed in the first bonding method in First Embodiment. Table 3 shows the constitutions and compressive deformation rates of the various conductive bonding materials produced in the present embodiment as well as shearing strength obtained in the bonding test.

TABLE 3

| | Metal Powder | | Drying | Compressive | Shear Strength |
|---|---|---|---|---|---|
| No. | Metal | Purity | Particle Size | Temperature | Deformation Rate | (Test Pressure: 5 MPa) |
| 1 | Au | 99.99% | 0.3 μm | 60° C. | 20% | 30 MPa |
| 2 | | | 0.5 μm | | 16% | 28 MPa |
| 3 | | | 1.2 μm | | 18% | 18 MPa |
| 4 | | 98% | 0.3 μm | | 17% | 15 MPa |
| 5 | Ag | 99.90% | 0.5 μm | | 21% | 25 MPa |
| 6 | Pt | | 0.3 μm | | 18% | 28 MPa |
| 7 | Pd | | 0.3 μm | | 18% | 27 MPa |

It was confirmed from Table 3 that the conductive bonding material could be produced from a metal powder other than gold, and that bonding at a low pressure could be performed with such a material (Nos. 5 to 7). Besides, as for an average particle size of the metal powder, when the particle size was 1.0 μm or less, an effective conductive bonding material could be obtained, but when a coarse gold powder having a particle size larger than 1.0 μm was used, the bonding strength varied even when the other conditions were favorable (No. 3). The same should apply when the purity of the gold powder was low (No. 4). The particle size and the purity of the gold powder little affects the compressive deformation rate of the conductive bonding material if the drying temperature is low. When the particle size and the purity of the metal powder are inappropriate, however, the plastic deformation and the densification of the metal powder in the bonding process are harmfully affected, which probably reduces the bonding strength. When the bonding conditions alone were changed to those of the bonding test by the second bonding method of First Embodiment to measure shear strength in the same manner as in the present embodiment, results similar to the results shown in Table 3 obtained by the first bonding method were obtained.

Figure 7:
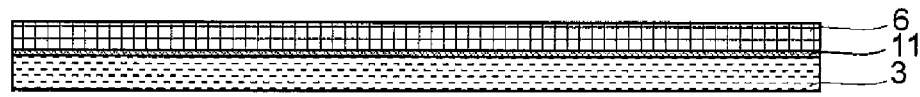
FIG. 7 is a diagram for explaining a production process (using a resist) for a bonding member of Third Embodiment.
Figure 7:
Figure 7:
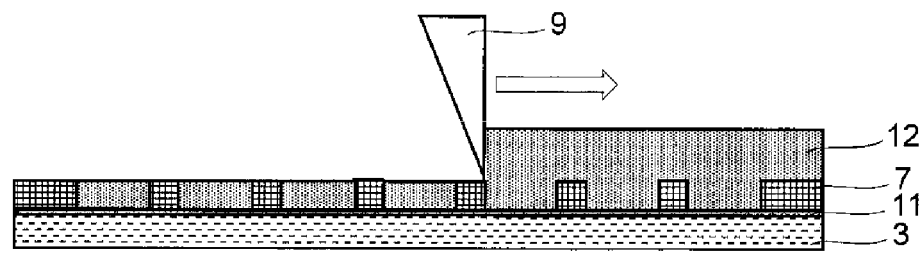
Figure 7:
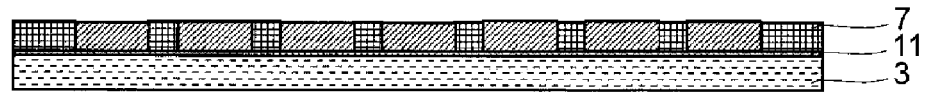
Figure 7:
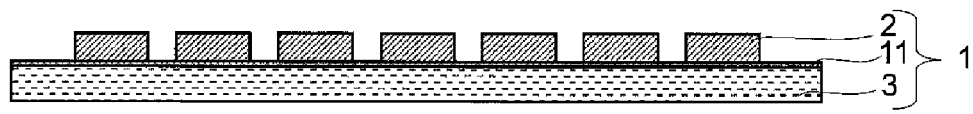

Third Embodiment: In this embodiment, resist application and pattern etching were performed on a base material having a metal film formed thereon, and the metal paste of First Embodiment was applied on the resultant to produce a bonding member. Thereafter, a bonding test for a semiconductor chip was performed. FIG. 7 illustrates a production process for producing a bonding member of the present embodiment. Now, the production process for producing the bonding member of the present embodiment will be described with reference to FIG. 7.

(1) Preparation of Base Material

A base material similar to that used in First Embodiment was prepared, and a metal film was formed on the base material. As the metal film, a gold film having a thickness of 50 nm was formed by sputtering. Then, a resist was applied on the base material (on the metal film) (FIG. 7(*i*)). In the present embodiment, a commercially available photoresist (AZP4903, manufactured by Kayaku Microchem Corp.) was dropped on the base material to be spin coated, and the resultant was prebaked. Then, the resist film was etched by masking and exposure to form a resist film having a hole pattern for forming a conductive bonding material (FIG. 7(*ii*)). In the present embodiment, the resist film was treated by patterning under conditions of irradiating g-line (wavelength: 436 nm) at an illuminance of 2100 mj/cm² for an exposure time of 150 seconds, and etching the resultant.

(2) Application of Metal Paste

Next, the metal paste was applied on the base material (on the metal film) to fill the metal paste in gaps in the resist film. The metal paste was the same as that used in First Embodiment. The metal paste was applied in a vacuum chamber (35 kPa) at room temperature by dropping the metal paste on the base material (on the metal film) to be spread with a spatula, so as to fill the metal paste in the gaps in the resist film. Thereafter, preliminary drying was performed in the vacuum chamber evacuated (5 kPa) at room temperature. Then, an excessive portion of the metal paste after the preliminary drying was removed with a blade (FIG. 7(*iii*)).

(3) Drying of Metal Paste

Then, the metal paste resulting from the preliminary drying was dried to form a conductive bonding material containing a dried product (FIG. 7(*iv*)). In the same manner as in First Embodiment, the base material was placed in a drying furnace (air atmosphere) to be dried at a drying temperature of 65° C. for 10 minutes.

(4) Post-Process (Removal of Resist Film)

After the drying process, the resist film was removed with a stripping solution. In the present embodiment, the base material was immersed in acetone to remove the resist film. Through this resist removal, a bonding member on which a plurality of pieces of the conductive bonding material having a prescribed aspect ratio were disposed at a prescribed interval was produced (FIG. 7(*v*)). In the bonding member produced in the present embodiment, all the pieces of the conductive bonding material had an aspect ratio of 5, and the interval between the pieces of the conductive bonding material was 2 to 5 µm.

Besides, the height (thickness) of the conductive bonding material was 10±1 µm, which was substantially the same as the thickness of the resist. As a result, it was confirmed that the conductive bonding material disposed on the bonding member of the present embodiment was excellent in flatness as a whole. In this manner, it was confirmed that when the resist was appropriately applied, the heights of the respective pieces of the conductive bonding material could be made equal, and that a conductive bonding material in the shape of a film in a pseudo manner could be formed.

[Bonding Test]

The bonding member of the present embodiment produced through the above-described processes was used to perform a bonding test for bonding a GaN semiconductor chip (thickness of 0.6 mm×5 mm square) to a Si substrate (thickness of 0.75 mm×10 mm square; Ti/Pt/Au plated). The bonding test here was performed basically through the same procedures as those of the first bonding method and the second bonding method of First Embodiment.

During this bonding test, the semiconductor chip mounted on the conductive bonding material was not shifted, and could be accurately bonded to the Si substrate. In addition, as a result of the bonding test, shear strength (test pressure: 5 MPa) of a bonding portion between the semiconductor chip and the Si substrate exhibited a sufficient bonding force of 30 MPa or more.

Figure 8:
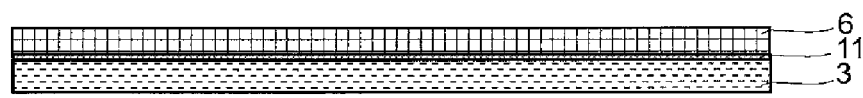
FIG. 8 is a diagram for explaining a production process for a bonding member of Fourth Embodiment.
Figure 8:
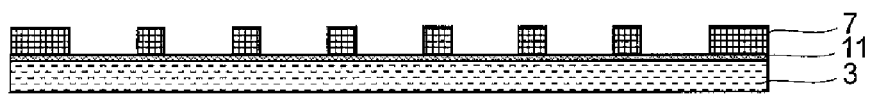
Figure 8:
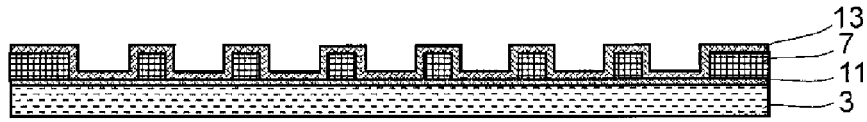
Figure 8:
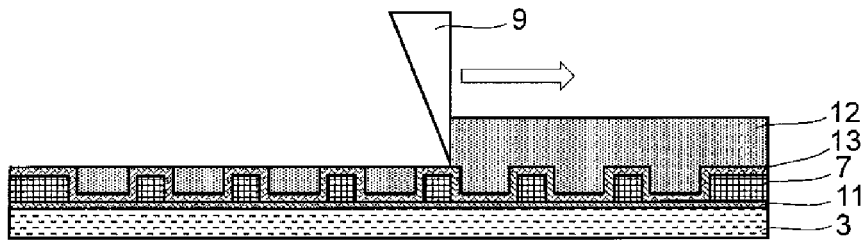
Figure 8:
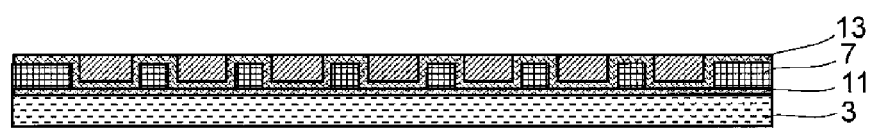
Figure 8:
Figure 8:
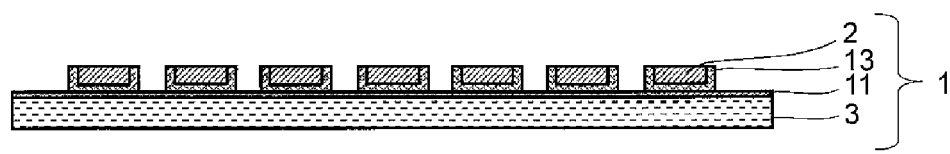

Fourth Embodiment: In this embodiment, a bonding member was produced in the same manner as in Third Embodiment except that, on a base material provided with a metal film and a resist film having a hole pattern, a metal film was further formed to form the metal film in two layers on a bottom of a conductive bonding material. FIG. 8 illustrates a production process for producing the bonding member of the present embodiment. The production process for producing the bonding member of the present embodiment will now be described with reference to FIG. 8.

(1) Preparation of Base Material

In the same manner as in Third Embodiment, a metal film having a thickness of 50 nm was formed on a base material, and a resist was further applied thereon (FIG. 8(*i*)). Then, in the same manner as in Third Embodiment, a resist film having a hole pattern was formed (FIG. 8(*ii*)). On the base material having the pattern of the resist film, a gold film having a thickness of 5 nm was formed by sputtering (FIG. 8(*iii*)).

(2) Application of Metal Paste

In the same manner as in Third Embodiment, a metal paste was filled in gaps in the resist film (metal film), the resultant was subjected to preliminary drying in a vacuum chamber at room temperature, and then, an excessive portion of the metal paste after the preliminary drying was removed with a blade (FIG. 8(*iv*)).

(3) Drying of Metal Paste

Then, the metal paste after the preliminary drying was dried to form a conductive bonding material containing a dried product (FIG. 8(*v*)). In the same manner as in Third Embodiment, the base material was placed in a drying furnace (air atmosphere) to be dried at 65° C. for 10 minutes.

(4) Post-Process (Removal of Resist Film)

Figure 9:
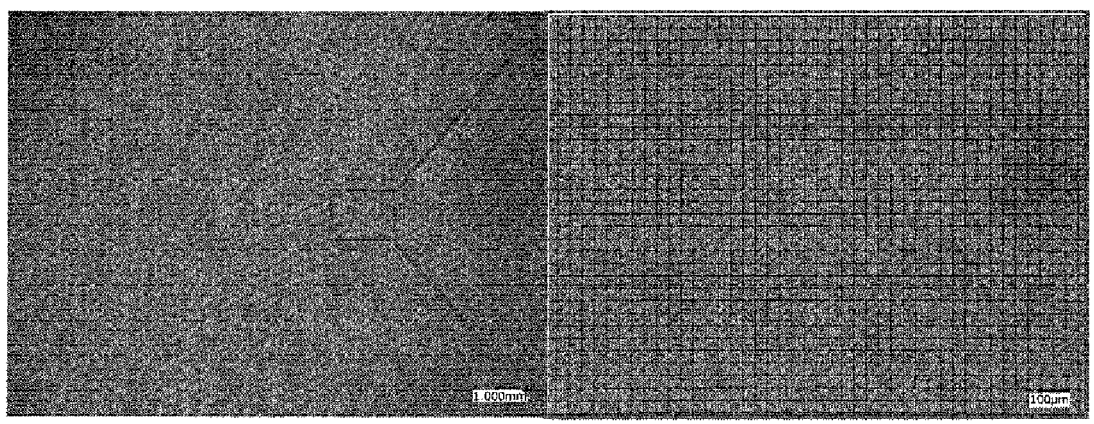
FIG. 9 is a diagram illustrating the appearance of a surface of the bonding member and the appearance of a conductive bonding material produced in Fourth Embodiment.

After the drying process, the metal film disposed on the resist film was removed by etching with aqua regia (FIG. 8(*vi*)). Thereafter, in the same manner as in Third Embodiment, the resist film was removed with a stripping solution, and thus, a bonding member on which a plurality of pieces of the conductive bonding material having a prescribed aspect ratio were disposed at a prescribed interval was produced (FIG. 8(*vii*)). In the bonding member produced in the present embodiment, all the pieces of the conductive bonding material had an aspect ratio of 5, and the interval between the pieces of the conductive bonding material was 2 to 5 µm. FIG. 9 illustrates the appearance of a surface of the bonding member produced in this Fourth Embodiment, and the appearance of the conductive bonding material partially enlargedly observed.

[Bonding Test]

The bonding member of the present embodiment produced through the above-described processes was used to perform a bonding test under the same conditions as those employed in Third Embodiment. As a result, also during the bonding test of the present embodiment, the semiconductor chip was not shifted, and could be accurately bonded. In addition, as a result of the bonding test, shear strength of a bonding portion between the semiconductor chip and the Si substrate exhibited a sufficient bonding force (30 MPa or more).

INDUSTRIAL APPLICABILITY

As described so far, the present invention is useful as a conductive bonding material applied to die bonding or flip-chip bonding of a semiconductor device to a substrate. According to a conductive bonding material of the present invention and a bonding member including the same, sufficient bonding strength can be obtained simultaneously with reducing both a temperature and a pressure employed in bonding. Accordingly, it is particularly suitable as a bonding member in an organic substrate requiring temperature reduction in bonding, and a compound semiconductor requiring pressure reduction in bonding.

REFERENCE SIGNS LIST 1 bonding member
2 conductive bonding material
3 base material
4 semiconductor chip
5 substrate
6 photoresist film
7 resist film
8 metal paste
9 blade
11, 13 metal film
12 excessive portion of metal paste
d interval between pieces of conductive bonding material
W width of bonding surface

What is claimed is:

1. A bonding member, comprising a base material, a plurality of pieces of a conductive bonding material on the base material, and one or more metal films formed between the base material and the conductive bonding material, the conductive bonding material being provided on the metal film,
wherein the conductive bonding material comprises a molded article of a metal powder,
wherein the metal powder is one or more selected from the group consisting of a gold powder, a silver powder, a platinum powder, and a palladium powder, and has a purity of 99.9% by mass or more, and an average particle size of 0.005 µm to 1.0 µm, and the conductive bonding material has a compressive deformation rate M, represented by the following expression, of 5% or more and 30% or less when compressed with a compression pressure of 5 MPa:

$$M=\{(h1-h2)/h1\}\times 100 \quad \text{[Expression 1]}$$

wherein h1 represents an average thickness of the conductive bonding material before compression, and h2 represents an average thickness of the conductive bonding material after the compression, wherein an interval between the plurality of pieces of the conductive bonding material is 1 μm to 10 μm, and each of the pieces of the conductive bonding material has an aspect ratio R, represented by the following expression, of 1 or more and 100 or less, $$R=\{(X+Y)/2\}/h1 \quad \text{[Expression 2]}$$

wherein X represents a length of a short side of each piece of the conductive bonding material in a plane direction of the base material, Y represents a length of a long side of each piece of the conductive bonding material in the plane direction of the base material, and h1 represents an average thickness of the conductive bonding material before compression.

2. A bonding method for bonding a semiconductor chip to a substrate with the bonding member defined in claim 1, comprising the steps of:

mounting the semiconductor chip on one or more pieces of the conductive bonding material disposed on the bonding member, and after subjecting to compression and heating, picking up the semiconductor chip from the base material of the bonding member; and bonding the semiconductor chip to the substrate by compression and heating with the semiconductor chip having the conductive bonding material mounted thereon placed on the substrate.

3. The bonding method according to claim 2, wherein in the step of mounting the conductive bonding material on the semiconductor chip, the conductive bonding material is heated at 40° C. or more and 100° C. or less while being compressed at 30 MPa or less.

4. The bonding method according to claim 3, wherein in the step of bonding the semiconductor chip to the substrate, the conductive bonding material is heated at 80° C. or more and 300° C. or less while being compressed at 30 MPa or less.

5. The bonding method according to claim 2, further comprising, after the step of bonding the semiconductor chip to the substrate, a step of sintering the conductive bonding material by heating the conductive bonding material at 100° C. or more and 300° C. or less without compression.

6. A bonding method for bonding a semiconductor chip to a substrate with the bonding member defined in claim 1, comprising:

a step of mounting the conductive bonding material on the substrate by compression and heating with the substrate placed on the conductive bonding material disposed on the bonding member;

a step of picking up the substrate on which the conductive bonding material is mounted from the base material, and a step of bonding the semiconductor chip to the substrate via the conductive bonding material by compression and heating with the semiconductor chip placed on the metal film disposed on the conductive bonding material mounted on the substrate.

7. The bonding method according to claim 6, wherein in the step of mounting the conductive bonding material on the substrate, the conductive bonding material is heated at 40° C. or more and 100° C. or less while being compressed at 30 MPa or less.

8. The bonding method according to claim 7, wherein in the step of bonding the semiconductor chip to the substrate, the conductive bonding material is heated at 80° C. or more and 300° C. or less, and compressed at 30 MPa or less.

9. The bonding method according to claim 6, further comprising, after the step of bonding the semiconductor chip to the substrate, a step of sintering the conductive bonding material by heating the conductive bonding material at 100° C. or more and 300° C. or less without compression.

* * * * *